United States Patent
So et al.

(10) Patent No.: US 8,309,888 B2
(45) Date of Patent: Nov. 13, 2012

(54) ELECTRONIC APPARATUS, POWER CONTROL DEVICE FOR CONTROLLING A HEATER, AND METHOD OF CONTROLLING POWER CONTROL DEVICE

(75) Inventors: Tsuyoshi So, Kawasaki (JP); Hideo Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 346 days.

(21) Appl. No.: 12/748,554

(22) Filed: Mar. 29, 2010

(65) Prior Publication Data

US 2010/0243634 A1    Sep. 30, 2010

(30) Foreign Application Priority Data

Mar. 31, 2009  (JP) .................................. 2009-084044

(51) Int. Cl.
    *H05B 1/00*    (2006.01)
(52) U.S. Cl. ........... 219/209; 219/50; 219/507; 219/520
(58) Field of Classification Search .................... 219/50, 219/209, 507, 520
    See application file for complete search history.

(56) References Cited

FOREIGN PATENT DOCUMENTS
JP         60-42795        3/1985

*Primary Examiner* — Long Pham
(74) *Attorney, Agent, or Firm* — Staas & Halsey LLP (57) ABSTRACT

An electronic apparatus has a printed circuit board, a semiconductor device mounted on the printed circuit board by a plurality of solder bumps, a heater that heats the printed circuit, a power supply unit that supplies electric power to the semiconductor device and the heater, and a controller that controls the power supply unit to supply electric power to the heater when the electric power is not supplied to the semiconductor device.

11 Claims, 13 Drawing Sheets

ELECTRONIC APPARATUS, POWER CONTROL DEVICE FOR CONTROLLING A HEATER, AND METHOD OF CONTROLLING POWER CONTROL DEVICE

CROSS-REFERENCE TO RELATED APPLICATION

This application is based upon and claims the benefit of priority of the prior Japanese Patent Application No. 2009-084044, filed on Mar. 31, 2009, the entire contents of which are incorporated herein by reference.

FIELD

An embodiment discussed herein relates to electronic apparatus, power control device for controlling a heater, and method of controlling power control device.

BACKGROUND

A ball grid array (BGA) is a known example of a semiconductor package bonded to a printed circuit board. The BGA is bonded to a printed circuit board by means of the solder bumps.

As electric power is supplied into the semiconductor package and to the printed circuit board as a result of power-on operation and the electric power is interrupted as a result of subsequent power-off operation, the semiconductor package and the printed circuit board are subjected to cyclical temperature changes. Such temperature changes result in development of stress within the solder bumps owing to plastic strain therein. The degree of plastic strain increases with the number of power-on/off operations of an electronic circuit which includes the semiconductor package and the printed circuit board. The plastic strain occurs each time the electronic circuit is powered on or off. When the plastic strain reaches a limit value, the solder bumps break, making it impossible for the electronic circuit to operate normally.

Also, as the number of input/output terminals of semiconductor packages has increased owing to improved performance of electronic equipment in recent years, there is a tendency today for semiconductor packages to be of increased size. The larger the size of the semiconductor package, the more considerable the difference between the thermal expansion coefficients of the semiconductor package and the printed circuit board constructed of different kinds of materials, and the larger the plastic strain in the solder bumps. Accordingly, an increase in the size of the semiconductor package results in a reduction in the number of power-on/off operations at which breakage of the solder bumps occurs, and in a reduction in the number of years of service life of the electronic equipment employing the aforementioned type of electronic circuit. While such a problem is particularly noticeable in BGA-type semiconductor packages, the problem can occur in all electronic circuits including a semiconductor package and a printed circuit board bonded by solder bumps.

A method of preventing the aforementioned plastic strain problem is to keep electronic equipment operating at all times without powering off (and on) the equipment. Another technique for preventing a rapid change in the temperature of an electronic circuit is to preheat the electronic circuit before power-on.

However, operating the electronic equipment ceaselessly to prevent the plastic strain as in the aforementioned method continuously supplies electric power to the equipment. Furthermore, if the electronic equipment is a server apparatus used as an information processing apparatus in which plastic strain is to be avoided, for example, there arises a problem that running a fan for dissipating heat produced by the operating apparatus and an air conditioner for keeping a room where the server apparatus is located at a desired room temperature, thereby consuming additional electric power. Also, although it is possible to prevent rapid changes in the temperature of the electronic circuit by the aforementioned preheating approach, plastic strain in the solder bumps may occur because this approach is not intended to decrease a temperature difference caused by power-on/off operations.

Patent Document 1Japanese Laid-open Utility Model Application Publication No. 1985-042795

SUMMARY

According to an aspect of an embodiment, an electronic apparatus has a printed circuit board, a semiconductor device mounted on the printed circuit board by a plurality of solder bumps, a heater that heats the printed circuit, a power supply unit that supplies electric power to the semiconductor device and the heater, and a controller that controls the power supply unit to supply electric power to the heater when the electric power is not supplied to the semiconductor device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 12:
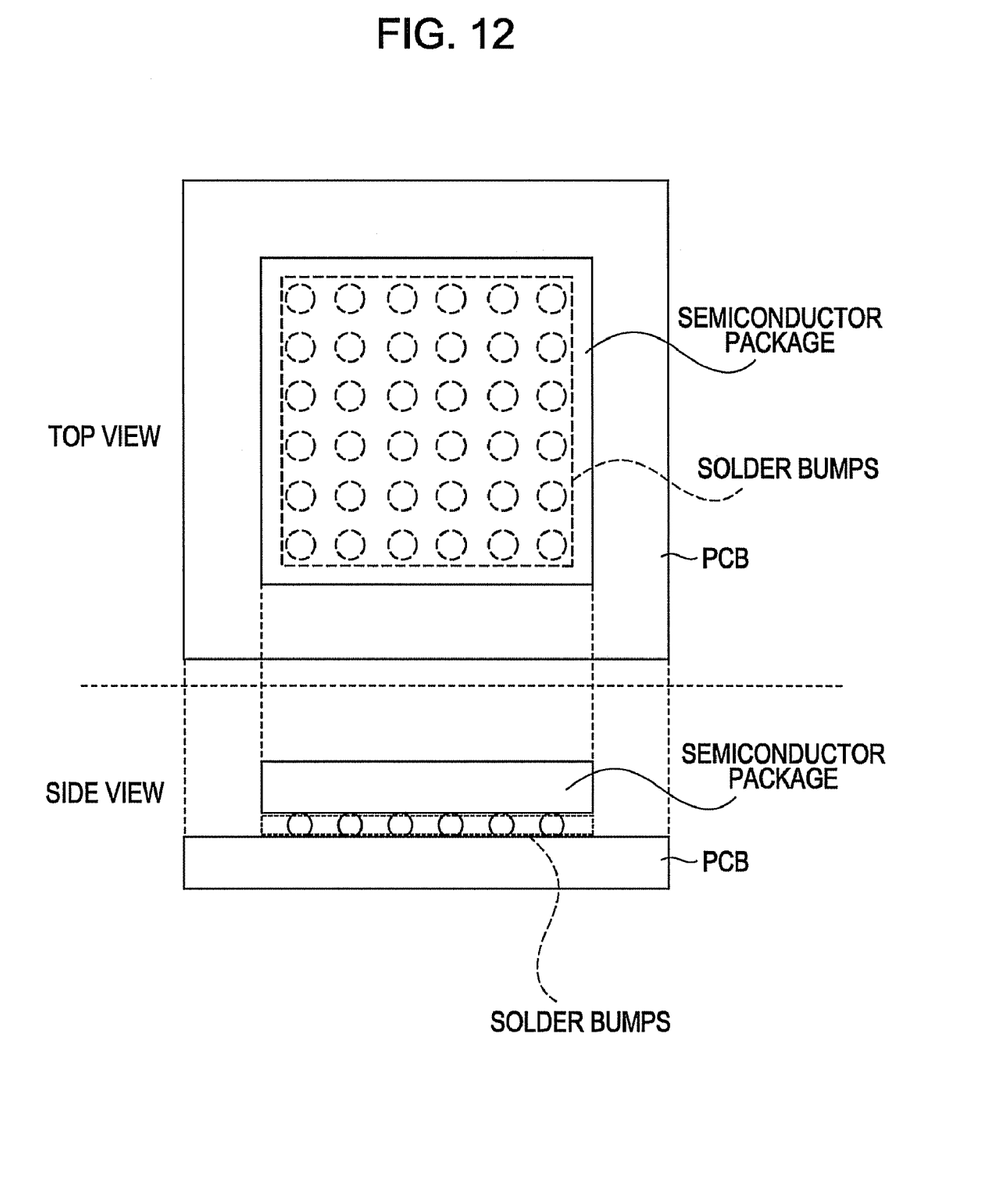
FIG. 12 is a diagram illustrating top and side views of a BGA.

FIG. 12 is a diagram illustrating top and side views of a BGA-type semiconductor package. As illustrated in FIG. 12, the BGA-type semiconductor packages is a semiconductor package having solder bumps which are arranged in a grid pattern.

Figure 13:
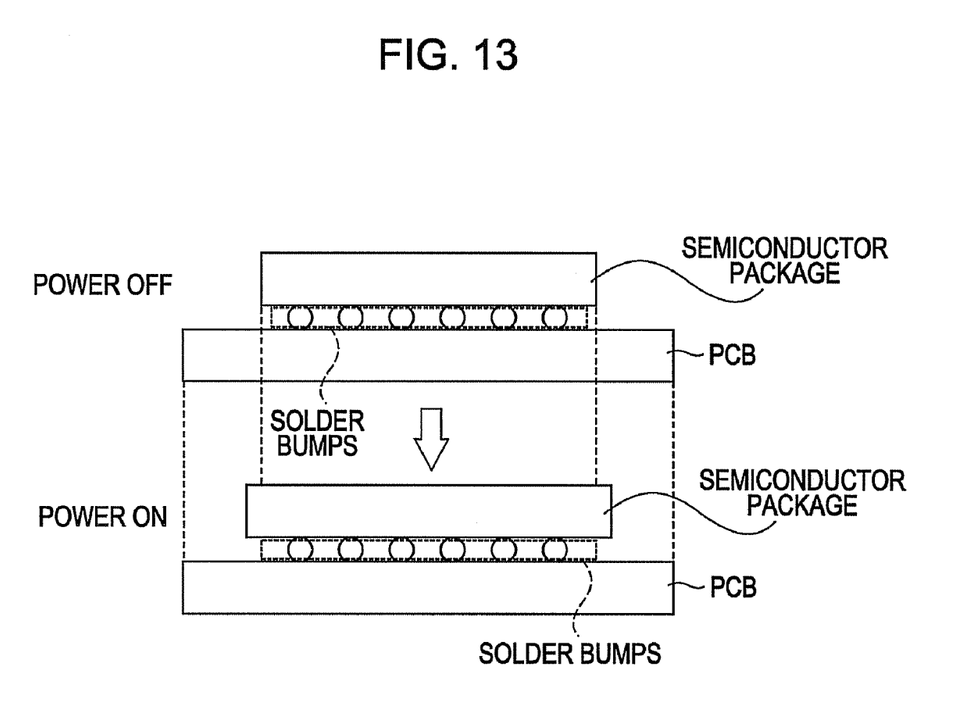
FIG. 13 is a diagram illustrating plastic strain that occurs in solder bumps when electric power is supplied.

FIG. 13 is a diagram illustrating plastic strain that occurs in solder bumps when electric power is supplied. Since the semiconductor package and the printed circuit board have different thermal expansion coefficients, plastic strain occurs in the solder bumps interconnecting the semiconductor package and the printed circuit board owing to the temperature changes caused by power-on/off operations as can be seen in FIG. 13.

Power control devices, electronic apparatuses having an electronic circuit mounted therein and power control methods according to individual embodiments are described hereinbelow with reference to the accompanying drawings.

Figure 1:
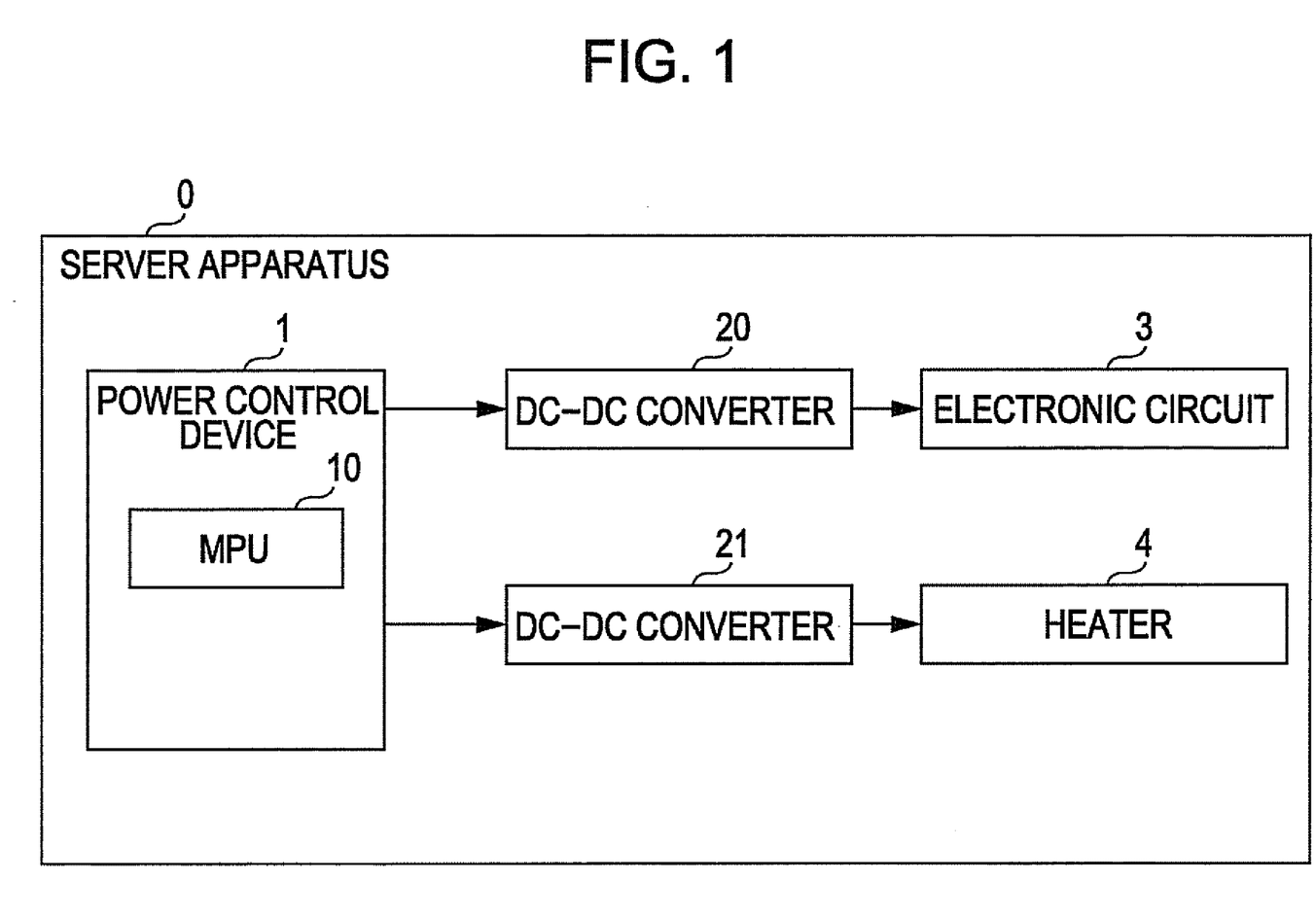
FIG. 1 is a diagram illustrating a hardware configuration of a server apparatus according to a first embodiment.

First, a hardware configuration and a power supply system of a server apparatus 0 serving as an electronic apparatus having an electronic circuit 3 mounted therein according to a first embodiment will be described. FIG. 1 is a diagram illustrating the hardware configuration of the server apparatus 0 according to the first embodiment, and FIG. 2 is a diagram illustrating the power supply system of the server apparatus 0 according to the first embodiment.

Referring to FIG. 1, the server apparatus 0 of this embodiment includes a power control device 1, DC-DC (Direct Current-Direct Current) converters 20, 21, the aforementioned electronic circuit 3 and a heater 4. The power control device 1 supplies electric power to the electronic circuit 3 and the heater 4 through the DC-DC converters 20 and 21, respectively. The power control device 1 includes a micro processing unit (MPU) 10 serving as an arithmetic processing device for controlling a supply of electric power to the electronic circuit 3 and the heater 4. The DC-DC converter 20 converts an input DC (Direct Current) voltage into a DC voltage of an electric current supplied to the electronic circuit 3, whereas the DC-DC converter 21 converts an input DC voltage into a DC voltage of an electric current supplied to the heater 4. The heater 4 serves to heat the electronic circuit 3 which will be described later.

Figure 2:
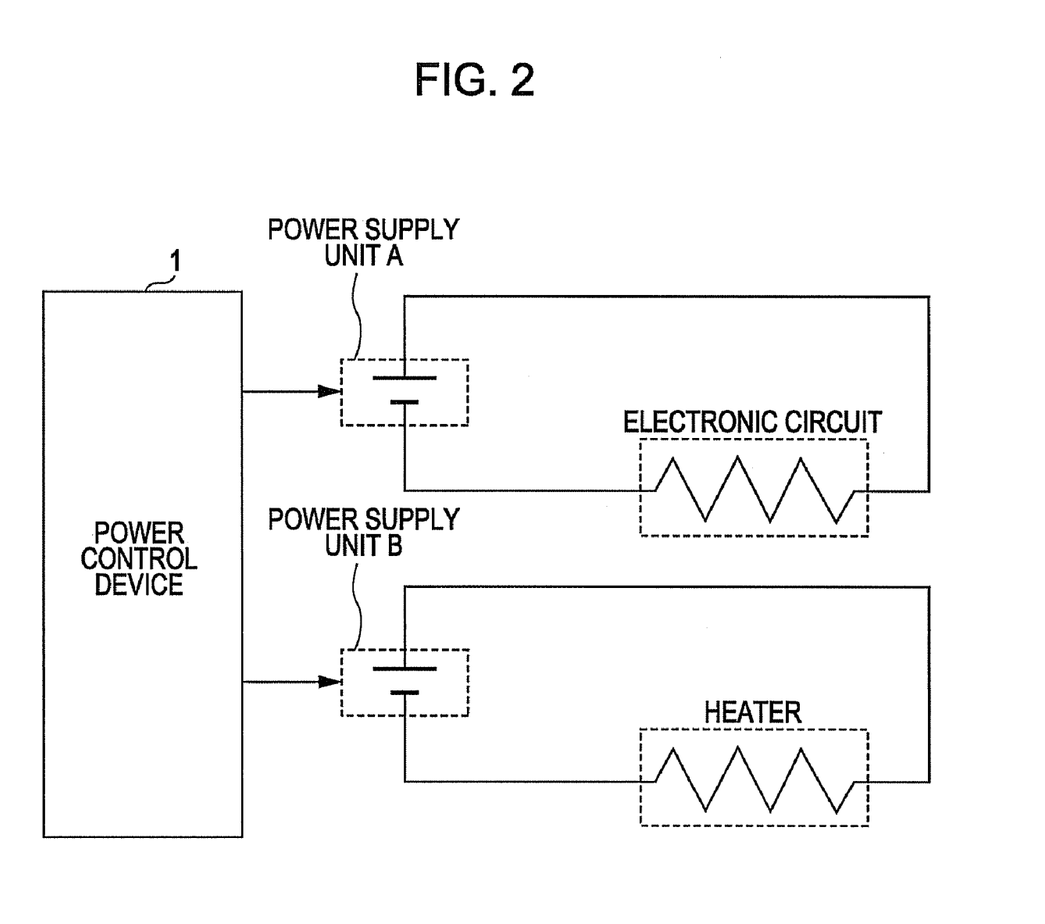
FIG. 2 is a diagram illustrating a power supply system of the server apparatus according to the first embodiment.

The power supply system of the server apparatus 0 of this embodiment is divided into a power supply unit A which is a power source of the electronic circuit 3 and a power supply unit B which is a power source of the heater 4 as illustrated in FIG. 2, respectively. Therefore, electric power is supplied individually to the electronic circuit 3 and the heater 4 through independent power feeding systems. Here, it is assumed that the electronic circuit 3 produces heat equivalent to 35 W of power and reaches a temperature of 46 degrees Celsius under stable operating conditions and the amount of electric power supplied to the heater 4 is 9 W in this embodiment, for example. The amount of electric power supplied to the heater 4 is determined on the basis of the temperature of the electronic circuit 3 premeasured under stable operating conditions, the stable operating conditions designating a state in which the electronic circuit 3 in operation is at an average temperature.

Figure 3:
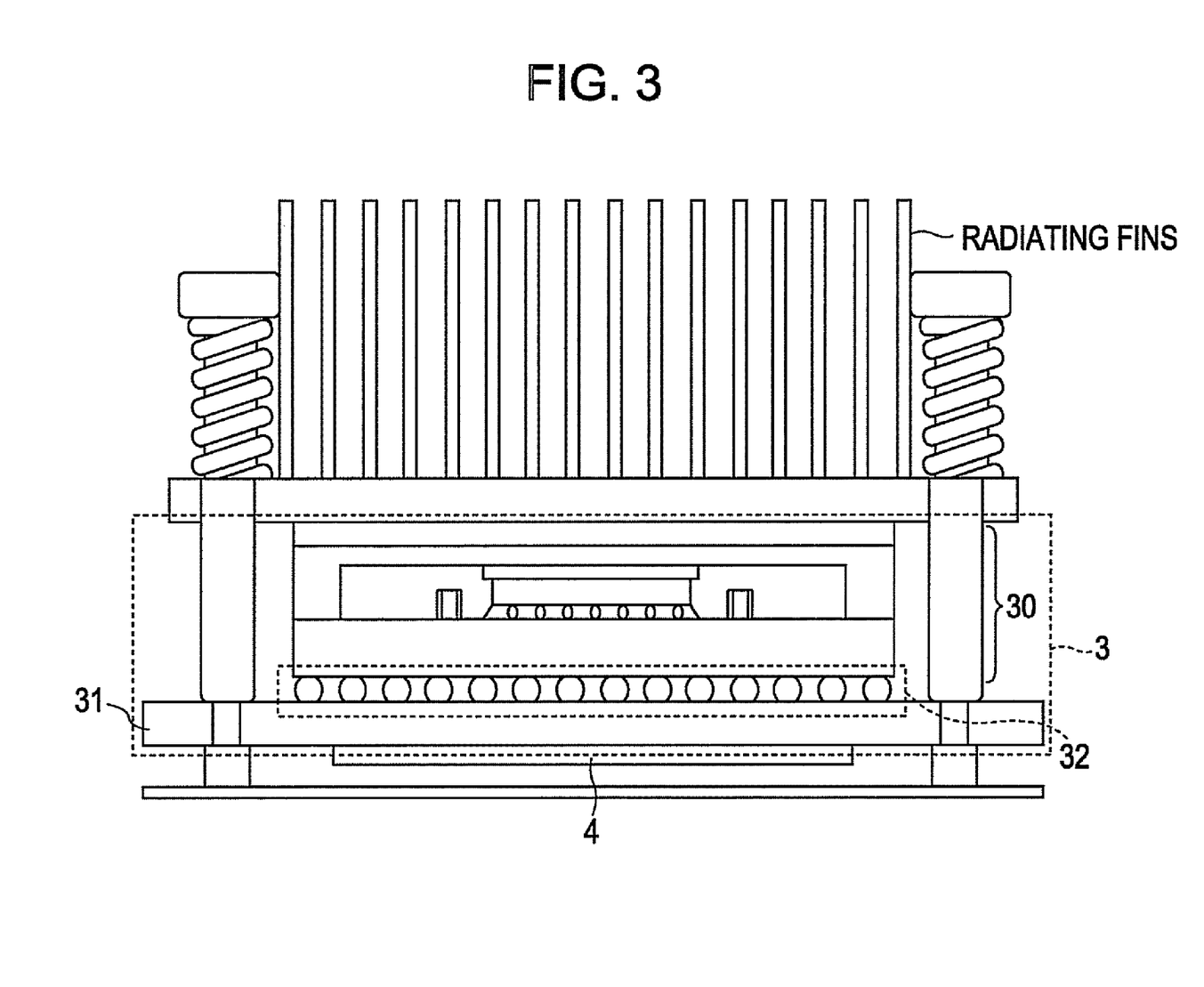
FIG. 3 is a diagram illustrating a configuration of an electronic circuit according to the first embodiment.

Next, a configuration of the electronic circuit 3 is described. FIG. 3 is a diagram illustrating the electronic circuit 3 according to the first embodiment.

Referring to FIG. 3, the electronic circuit 3 of this embodiment includes a BGA-type semiconductor package 30 and a printed circuit board 31 which are joined together by solder bumps 32. The printed circuit board 31 is fitted with the aforementioned heater 4 and radiating fins are attached to an upper part of the semiconductor package 30. It is to be noted that the heater 4 may be mounted at any location as long as the heater 4 can heat the electronic circuit 3.

Figure 4:
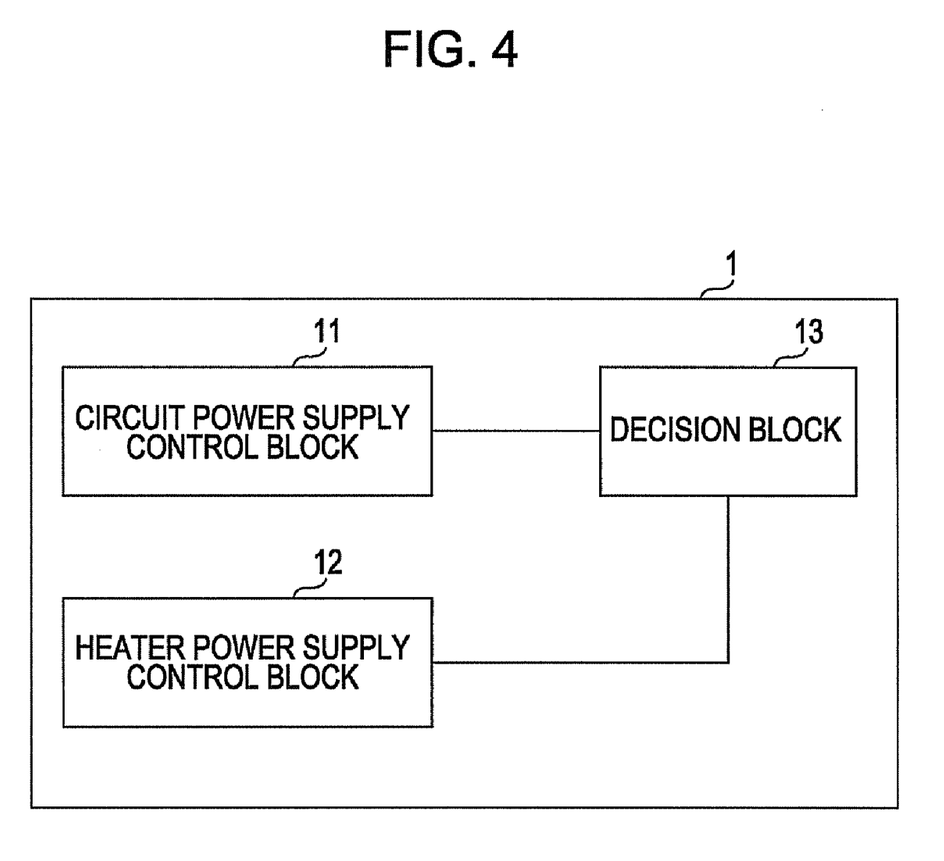
FIG. 4 is a diagram illustrating a functional configuration of a power control device according to the first embodiment.

A functional configuration of the power control device 1 of the present embodiment is now described. FIG. 4 is a diagram illustrating the functional configuration of the power control device 1 according to the first embodiment.

Referring to FIG. 4, the power control device 1 includes a circuit power supply control block 11 (first power controller), a heater power supply control block 12 (second power controller) and a decision block 13. The circuit power supply control block 11 controls on/off operations of a power supply (circuit power supply) which supplies electric power to the electronic circuit 3, wherein the circuit power supply is controlled when starting up the server apparatus 0. The decision block 13 determines whether the circuit power supply control block 11 turns on or off the circuit power supply. The heater power supply control block 12 controls on/off operations of a power supply (heater power supply) which supplies electric power to the heater 4 according to a decision made by the decision block 13. The circuit power supply control block 11, the heater power supply control block 12 and the decision block 13 are implemented using the MPU 10.

Figure 5:
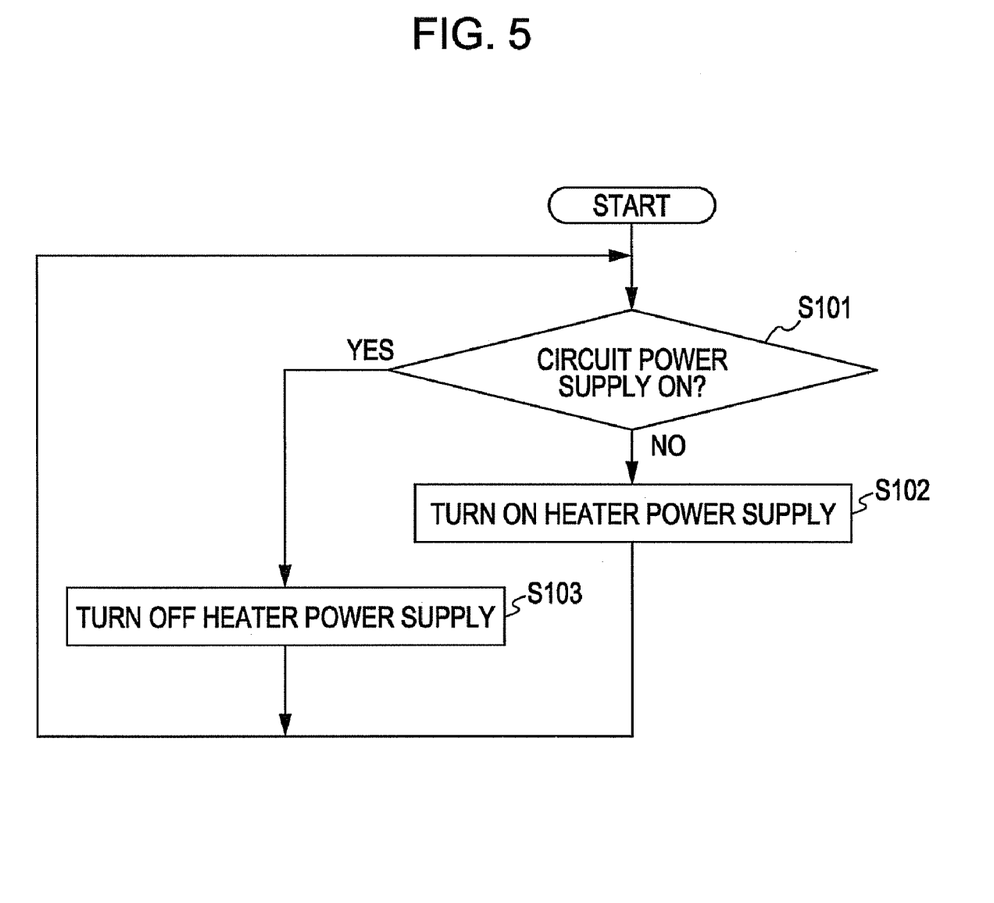
FIG. 5 is a flowchart illustrating power supply control operation performed by the power control device according to the first embodiment.

A power supply control operation performed by the power control device 1 is described. FIG. 5 is a flowchart illustrating the power supply control operation performed by the power control device 1 according to the first embodiment.

First, the decision block 13 judges whether the circuit power supply is turned on by the circuit power supply control block 11, that is, whether electric power is supplied to the electronic circuit 3 (S101).

If the circuit power supply is on (Yes in S101), the heater power supply control block 12 turns off the heater power supply to cut off the supply of electric power to the heater 4 (S103) and, then, the decision block 13 judges again whether the circuit power supply is on (S101).

If, on the other hand, the circuit power supply is not on (No in S101), the heater power supply control block 12 turns on the heater power supply to supply electric power to the heater 4 (S102) and, then, the decision block 13 judges again whether the circuit power supply is on (S101).

The electronic circuit 3 is fitted with the heater 4 and electric power is individually supplied to the electronic circuit 3 and the heater 4 respectively through the independent power feeding systems as discussed above. This arrangement makes it possible to maintain the electronic circuit 3 at a constant temperature by turning on the heater power supply when the circuit power supply is off. As a result, it is possible to reduce plastic strain in the solder bumps 32.

A second embodiment differs from the foregoing first embodiment in that a sensor is added to the electronic circuit and the heater power supply is controlled on the basis of a temperature measured by the sensor. The structure and working of the second embodiment differing from the first embodiment are described below. It is to be noted that the following discussion deals with points differing from the first embodiment and part of the structure of the second embodiment shared commonly with the first embodiment is not described below.

Figure 6:
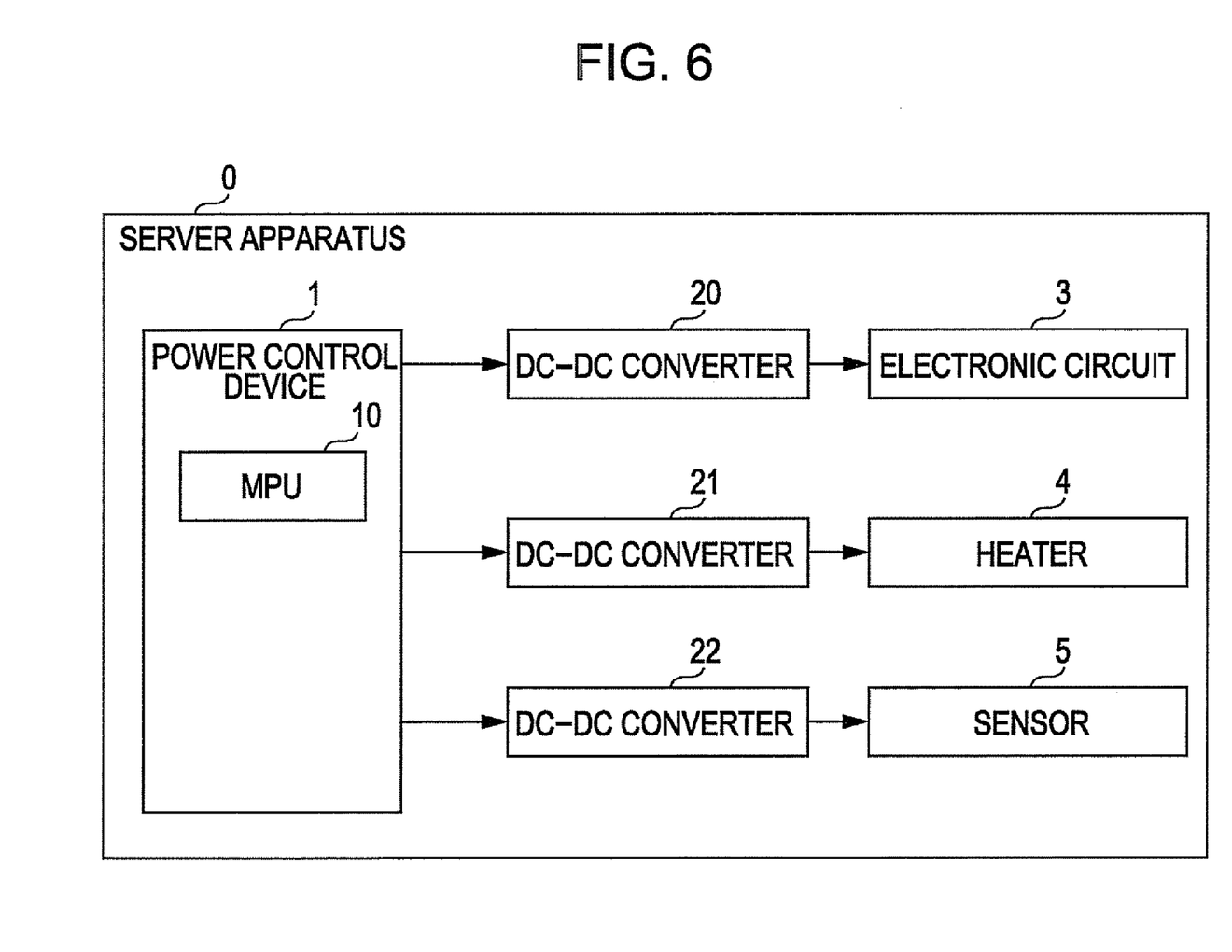
FIG. 6 is a diagram illustrating a hardware configuration of a server apparatus according to a second embodiment.

First, a hardware configuration and a power supply system of a server apparatus 0 according to the second embodiment will be described. FIG. 6 is a diagram illustrating the hardware configuration of the server apparatus 0 according to the second embodiment, and FIG. 7 is a diagram illustrating the power supply system of the server apparatus 0 according to the second embodiment.

As illustrated in FIG. 6, the server apparatus 0 of this embodiment further includes a sensor 5 and a DC-DC converter 22. The DC-DC converter 22 converts an input DC voltage into a DC voltage of an electric current supplied to the sensor 5 which measures the temperature of the electronic circuit 3. Here, it is assumed that the electronic circuit 3 reaches a temperature of 50 degrees Celsius under stable operating conditions in this embodiment, for example.

Figure 7:
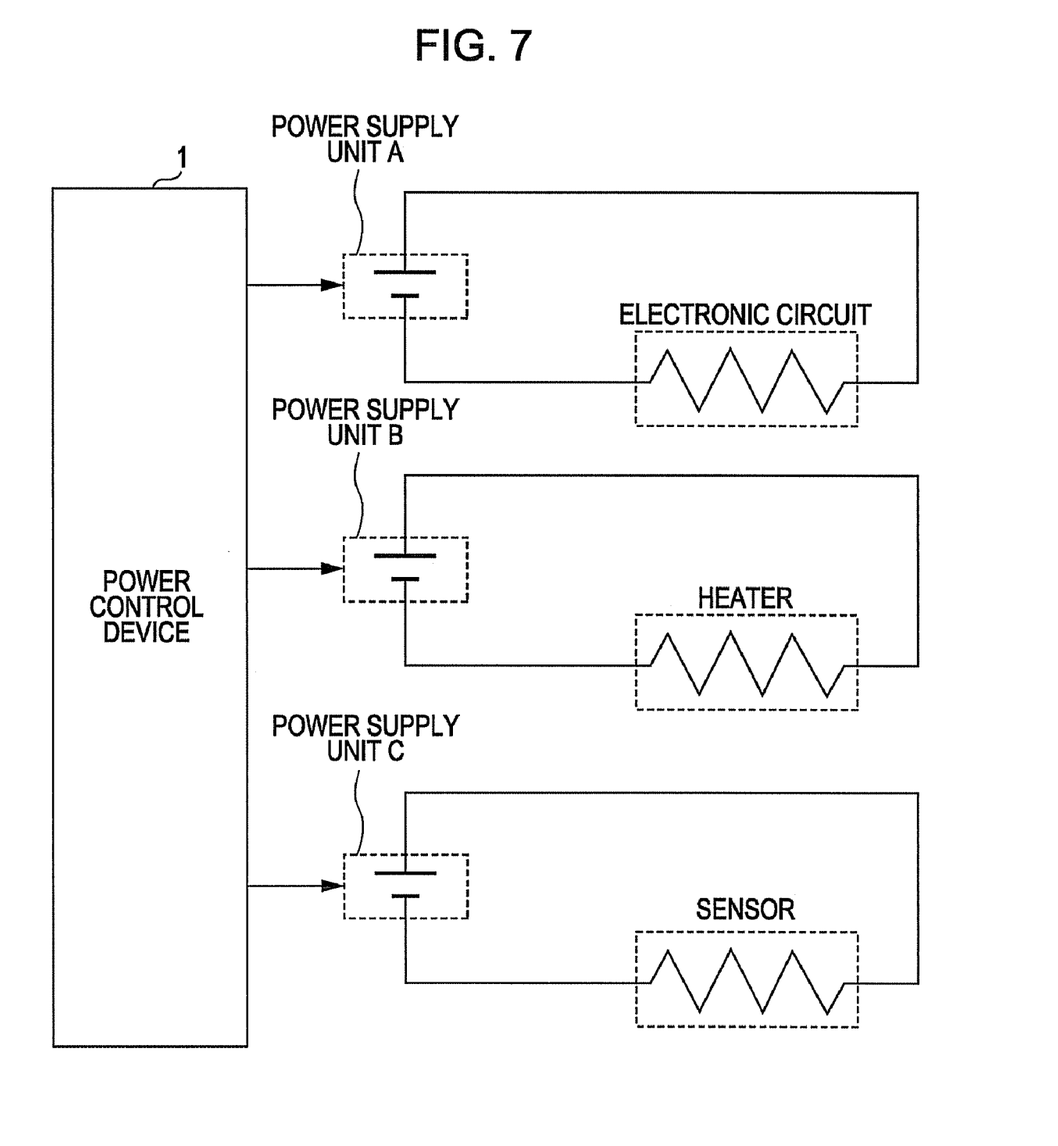
FIG. 7 is a diagram illustrating a power supply system of the server apparatus according to the second embodiment.

The power supply system of the server apparatus 0 of this embodiment is divided into a power supply unit A which is a power source of the electronic circuit 3, a power supply unit B which is a power source of the heater 4 and a power supply unit C which is a power source of the sensor 5 as illustrated in FIG. 7, so that electric power is supplied individually to the electronic circuit 3, the heater 4 and the sensor 5 respectively through different power feeding systems. The power supply unit C supplies electric power to the sensor 5 as long as the server apparatus 0 is kept powered on.

Figure 8:
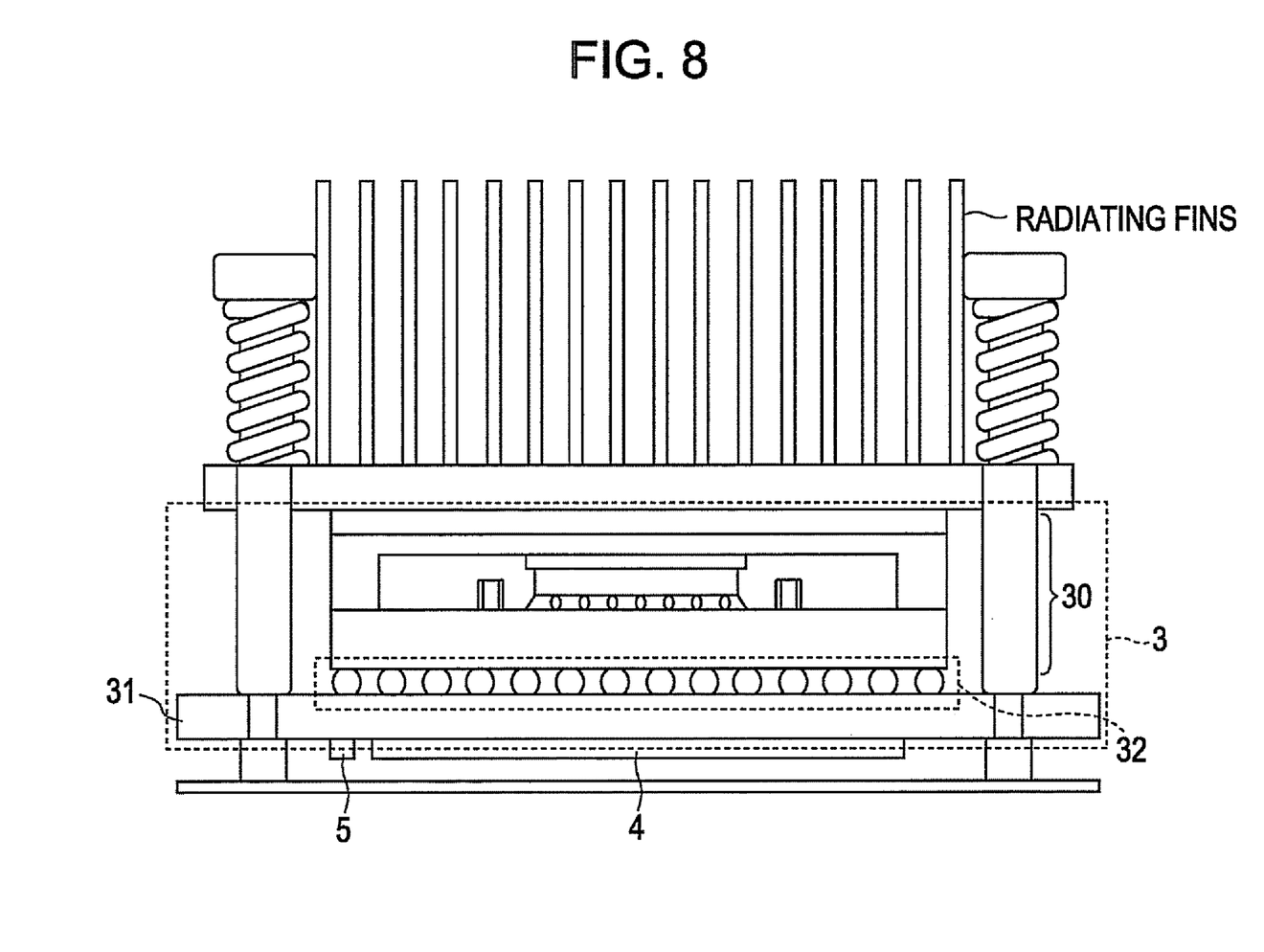
FIG. 8 is a diagram illustrating the location of a sensor relative to an electronic circuit according to the second embodiment.

The location of the sensor 5 is explained. FIG. 8 is a diagram illustrating the location of the sensor 5 relative to the electronic circuit 3 of the second embodiment.

The sensor 5 is mounted on a rear surface of the printed circuit board 31 as illustrated in FIG. 8, for example. However, the sensor 5 may be mounted at any location as long as the sensor 5 measures the temperature of the electronic circuit 3.

Figure 9:
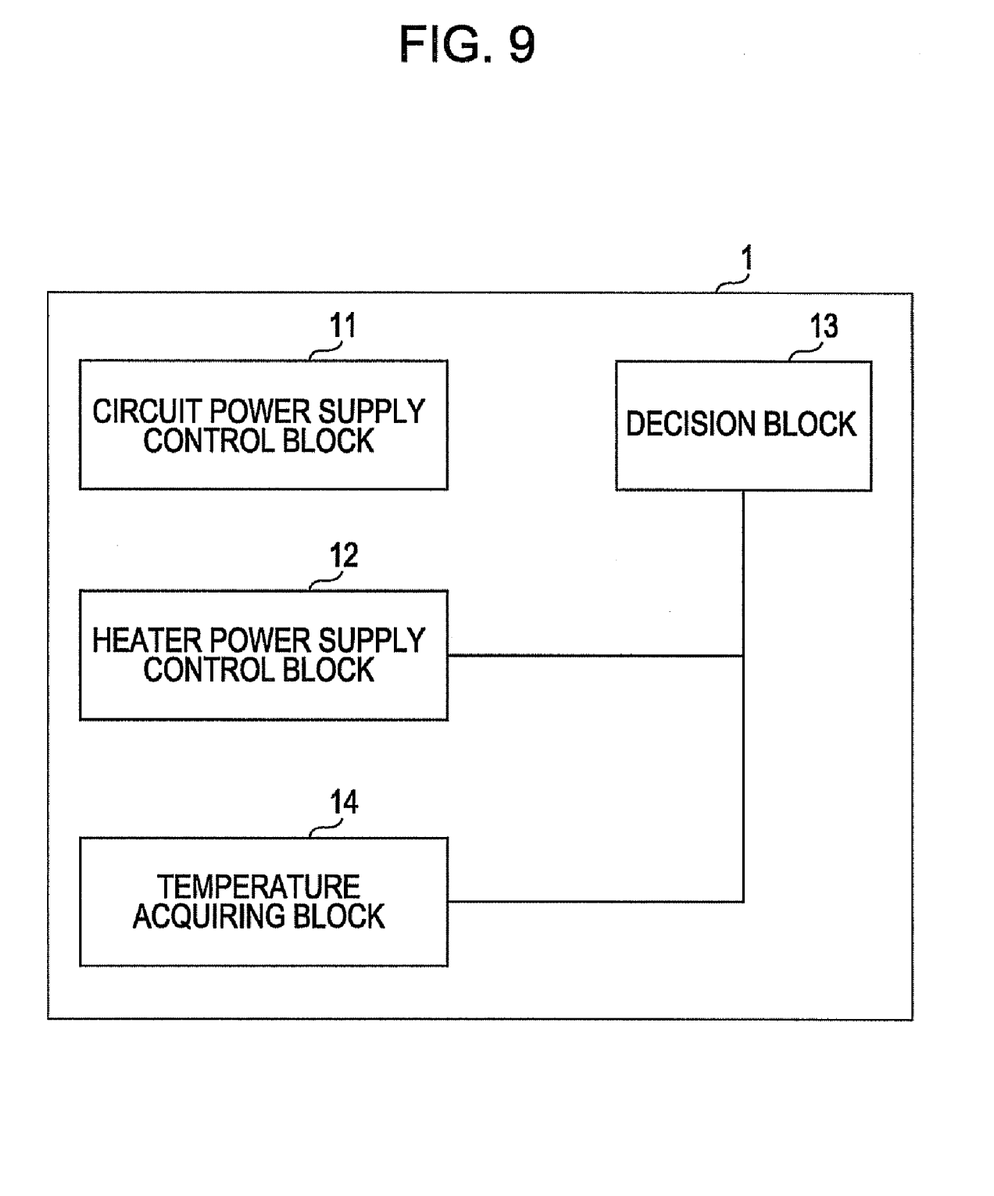
FIG. 9 is a diagram illustrating a functional configuration of a power control device according to the second embodiment.

A functional configuration of the power control device 1 of the second embodiment is now described. FIG. 9 is a diagram illustrating the functional configuration of the power control device 1 according to the second embodiment.

As can be seen in FIG. 9, the power control device 1 of this embodiment differs from that of the first embodiment in that the power control device 1 further includes a temperature acquiring block 14 (which includes a power supply portion and a temperature data acquiring portion). The temperature acquiring block 14 continuously supplies electric power to the sensor 5 and acquires temperature of the electronic circuit 3 measured by the sensor 5. In this embodiment, the decision block 13 determines whether the temperature of the electronic circuit 3 acquired by the temperature acquiring block 14 is equal to or higher than a specific temperature. The specific temperature may be any temperature equal to or higher than the temperature of the electronic circuit 3 reaches under stable operating conditions. In this embodiment, the specific temperature is set at 50 degrees Celsius, for example. The temperature acquiring block 14 is implemented using the MPU 10.

Figure 10:
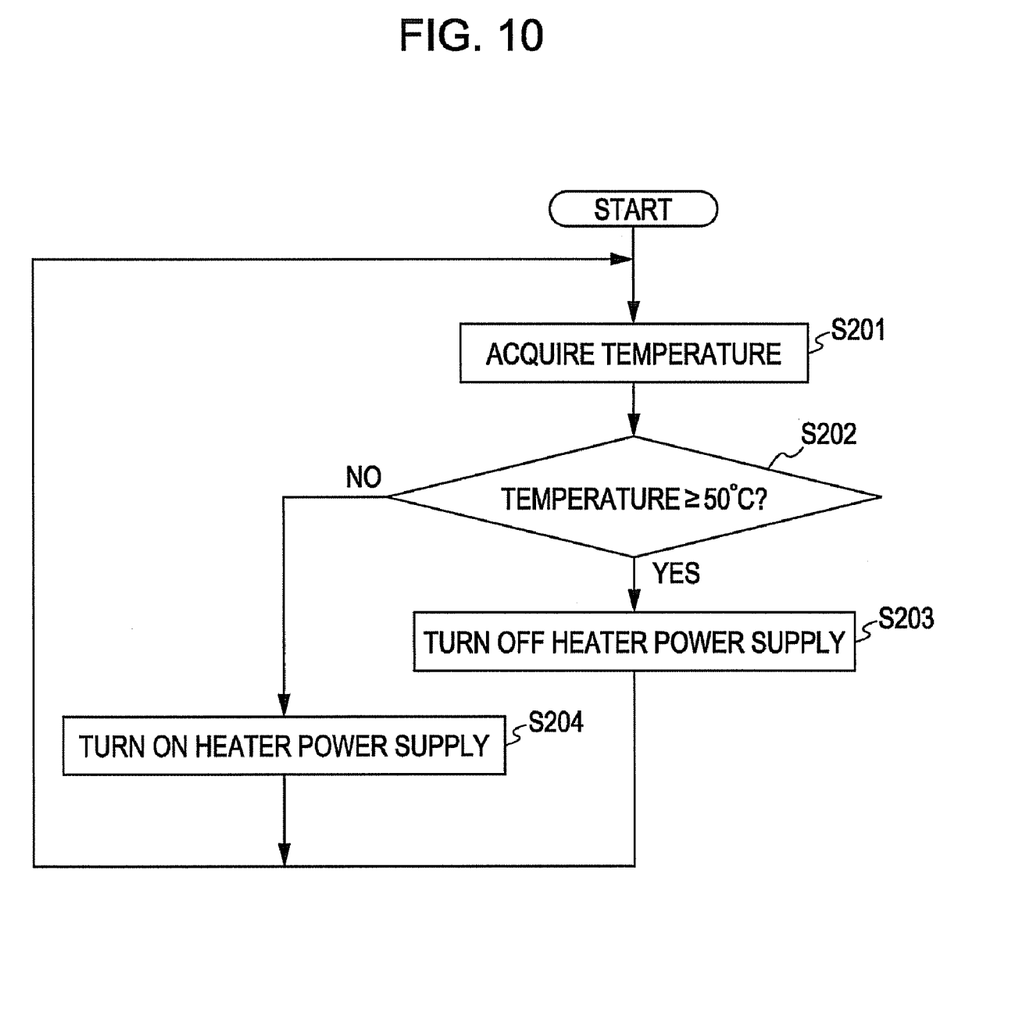
FIG. 10 is a flowchart illustrating power supply control operation performed by the power control device according to the second embodiment.

Power supply control operation performed by the power control device 1 is described. FIG. 10 is a flowchart illustrating the power supply control operation performed by the power control device 1 according to the second embodiment.

First, the temperature acquiring block 14 acquires temperature of the electronic circuit 3 measured by the sensor 5 as illustrated in FIG. 10 (S201).

Next, the decision block 13 judges whether the temperature of the electronic circuit 3 acquired by the temperature acquiring block 14 is equal to or higher than 50 degrees Celsius (S202).

If the temperature of the electronic circuit 3 is equal to or higher than 50 degrees Celsius (Yes in S202), the heater power supply control block 12 turns off the heater power supply (S203) and, then, the temperature acquiring block 14 acquires again temperature of the electronic circuit 3 (S201).

If, on the other hand, the temperature of the electronic circuit 3 is lower than 50 degrees Celsius (No in S202), the heater power supply control block 12 turns on the heater power supply (S204) and, then, the temperature acquiring block 14 acquires again temperature of the electronic circuit 3 (S201).

The power control device 1 of this embodiment is configured to measure the temperature of the electronic circuit 3 by means of the sensor 5 and to control the heater 4 so that the temperature of the electronic circuit 3 becomes equal to or higher than the temperature reaches under stable operating conditions. This arrangement makes it possible to maintain the temperature of the electronic circuit 3 at a fixed level or higher regardless of whether the power supply of the electronic circuit 3 is on or off. As a result, it is possible to reduce plastic strain in the solder bumps 32.

Figure 11:
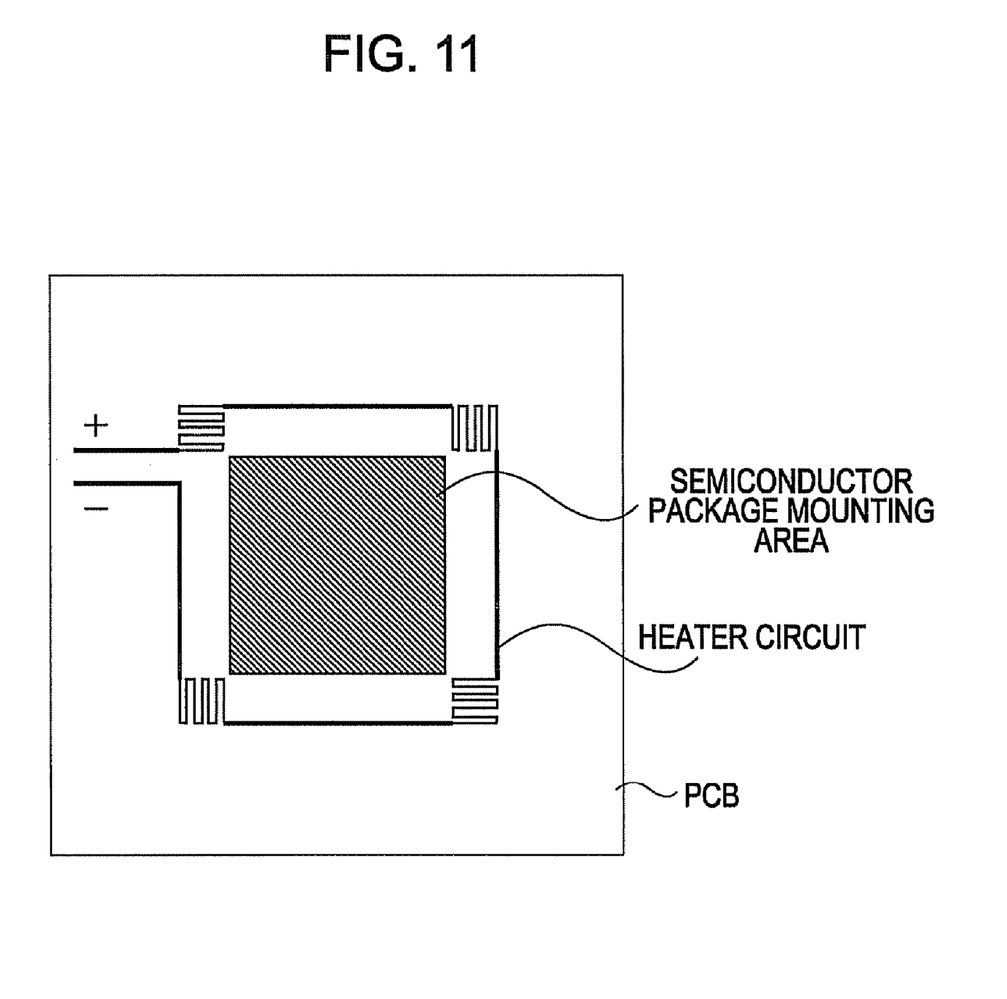
FIG. 11 is a diagram illustrating a heater according to a third embodiment.

While the heater 4 is mounted at a location where the heater 4 can heat the electronic circuit 3 in the foregoing first and second embodiments, the heater 4 is embedded in the printed circuit board 31 in the form of a heater circuit in a third embodiment. FIG. 11 is a diagram illustrating the heater 4 according to the third embodiment.

In this embodiment, the heater 4 is embedded in the printed circuit board 31 in the form of a heater circuit as illustrated in FIG. 11. The heater circuit is arranged to surround an area of the electronic circuit 3 where a semiconductor package is mounted. As the heater 4 is embedded in the printed circuit board 31 in this fashion, it is possible to heat the solder bumps 32 with high efficiency. The aforementioned arrangement of the third embodiment is similarly applicable to the foregoing first and second embodiments.

The aforementioned arrangement of the embodiment makes it possible to prevent the occurrence of plastic strain in solder bumps joining a semiconductor package to a printed circuit board with reduced power consumption.

As mentioned above, the present invention has been specifically described for better understanding of the embodiments thereof and the above description does not limit other aspects of the invention. Therefore, the present invention can be altered and modified in a variety of ways without departing from the gist and scope thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An electronic apparatus comprising:
    a printed circuit board;
    a semiconductor device mounted on the printed circuit board by a plurality of solder bumps;
    a heater that heats the printed circuit;
    a sensor that measures a temperature of the semiconductor device;
    a power supply unit that supplies electric power to the semiconductor device and the heater; and
    a controller that controls, based on the temperature measured by the sensor, the power supply unit to supply electric power to the heater when the electric power is not supplied to the semiconductor device.

2. The electronic apparatus of claim 1, wherein the heater heats an area of the printed circuit where the plurality of solder bumps are arranged.

3. The electronic apparatus of claim 1, wherein the power supply unit includes a first power feeder for supplying electric power to the semiconductor device and a second power feeder for supplying electric power to the heater.

4. The electronic apparatus of claim 1, wherein the heater is embedded as a circuit on the printed circuit board.

5. A power control device for controlling a heater for heating an electric circuit including a semiconductor device operable under supply of an electric power mounted on a printed circuit board by a plurality of solder bumps, the power control device comprising:
- a first power feeder that supplies electric power to the electric circuit;
- a sensor that measures a temperature of the electric circuit;
- a second power feeder that supplies electric power to the heater; and
- a controller that determines, based on the temperature measured by the sensor, whether the electric power is supplied to the electric circuit and enables the second power feeder to supply the electric power to the heater when the electric power is not supplied to the electric circuit.

6. The power control device of claim 5, wherein the controller controls the second power feeder to supply electric power to the heater when the temperature is lower than a predetermined temperature.

7. The power control device of claim 6, wherein the predetermined temperature is higher than or equal to an average temperature of the electric circuit that is operating under supply of the electric power.

8. The power control device of claim 5, wherein the heater is embedded as a circuit on the printed circuit board.

9. A method of controlling a power control device for controlling a heater that heats an electric circuit including a semiconductor device operable under supply of an electric power mounted on a printed circuit board by a plurality of solder bumps, the method comprising:
- controlling supply of electric power to the electric circuit by a first power feeder;
- controlling supply of electric power to the heater by a second power feeder;
- measuring a temperature of the electric circuit;
- determining whether electric power is supplied to the electric circuit by a controller; and
- enabling the second power feeder by the controller, based on the measured temperature, to supply electric power to the heater when electric power is not supplied to the electric circuit.

10. The method of claim 9, wherein the controller controls the second power feeder to supply electric power to the heater when the measured temperature is lower than a predetermined temperature.

11. The method of claim 10, wherein the predetermined temperature is higher than or equal to an average temperature of the electric circuit that is operating under supply of the electric power.

* * * * *